US008964385B2

(12) United States Patent
Lam et al.

(10) Patent No.: US 8,964,385 B2
(45) Date of Patent: Feb. 24, 2015

(54) AIR FLOW SYSTEM

(71) Applicant: Cisco Technology, Inc., San Jose, CA (US)

(72) Inventors: Mandy Hin Lam, Fremont, CA (US); Phillip S. Ting, San Jose, CA (US); Susheela Nanjunda Rao Narasimhan, Fremont, CA (US)

(73) Assignee: Cisco Technology, Inc., San Jose, CA (US)

( * ) Notice: Subject to any disclaimer, the term of this patent is extended or adjusted under 35 U.S.C. 154(b) by 314 days.

(21) Appl. No.: 13/646,416

(22) Filed: Oct. 5, 2012

(65) Prior Publication Data
US 2014/0098492 A1 Apr. 10, 2014

(51) Int. Cl.
| | |
|---|---|
| *H05K 7/20* | (2006.01) |
| *H01L 23/46* | (2006.01) |
| *H05K 5/00* | (2006.01) |
| *H05K 9/00* | (2006.01) |
| *H01L 23/467* | (2006.01) |

(52) U.S. Cl.
CPC ........ *H05K 7/20563* (2013.01); *H05K 7/20572* (2013.01); *H05K 9/0041* (2013.01); *H05K 7/20727* (2013.01); *H01L 23/467* (2013.01)
USPC ........... 361/695; 361/693; 361/800; 361/818; 454/184; 174/383; 174/377; 174/382

(58) Field of Classification Search
CPC ....... H05K 7/20145; H05K 7/20554–7/20572; H05K 7/20718–7/20727; H01L 23/467; H01L 23/46
USPC .............. 361/679.46–679.54, 688–723, 800, 361/818; 454/184; 385/134, 135; 174/383, 174/350, 377, 382
See application file for complete search history.

(56) References Cited

U.S. PATENT DOCUMENTS

| | | | | |
|---|---|---|---|---|
| 6,285,548 | B1 * | 9/2001 | Hamlet et al. ................. | 361/695 |
| 6,660,932 | B1 * | 12/2003 | Barringer et al. ............. | 174/358 |
| 6,826,056 | B2 * | 11/2004 | Tsuyuki et al. ............... | 361/725 |
| 6,860,641 | B1 * | 3/2005 | Goldenburg et al. .......... | 385/53 |
| 7,952,887 | B2 * | 5/2011 | Kosugi et al. ................ | 361/752 |
| 8,270,171 | B2 * | 9/2012 | Narasimhan et al. ......... | 361/713 |
| 2008/0011510 | A1 * | 1/2008 | Tang et al. .................... | 174/350 |

OTHER PUBLICATIONS

Arista Networks, Inc., "Arista 7100 Series 10G SFP Data Center Switches—Data Sheet," © 2009, 4 pages; http://www.aristanetworks.com/media/system/pdf/71 OO_Datasheet.pdf.

(Continued)

*Primary Examiner* — Zachary M Pape
(74) *Attorney, Agent, or Firm* — Patent Capital Group

(57) ABSTRACT

An apparatus is provided in one example embodiment and includes a faceplate having a plurality of slots arranged on a front portion of the faceplate, a top plate attached to a top portion of the faceplate, and a screen attached to the faceplate and the top plate. A channel may be disposed behind the faceplate and between a bottom surface of the top portion of the faceplate, a bottom surface of the top plate and a top surface of the screen. The screen may include a plurality of openings. In a specific embodiment, the apparatus may be removably attached to a removable line card of a switch. In a specific embodiment, air may be guided through the slots, by a fan operating behind the apparatus, along the channel and through the plurality of openings to one or more heat generating components on the line card.

19 Claims, 16 Drawing Sheets

(56) References Cited

OTHER PUBLICATIONS

O'Laughlin, et al., "Basic EMC Vent Panel Education," [retrieved and printed on Sep. 14, 2012], 3 pages; www.majr.com/docs/Basic_EMC_Vent_Panel_Education.pdf.

Cisco Systems, Inc., "Cisco Catalyst 4948 Switch," © 1992-2010, 20 pages; http://www.cisco.com/en/US/prod/collateral/switches/ps5718/ps6021/product_data_sheet0900aecd8017a72e.html.

Cisco Systems, Inc., "Cisco Nexus 5000 Series Switches," © 1992-2010; 22 pages; http://www.cisco.com/en/US/prod/collateral/switches/ps9441/ps9670/data_sheet_c78-461802.html.

* cited by examiner

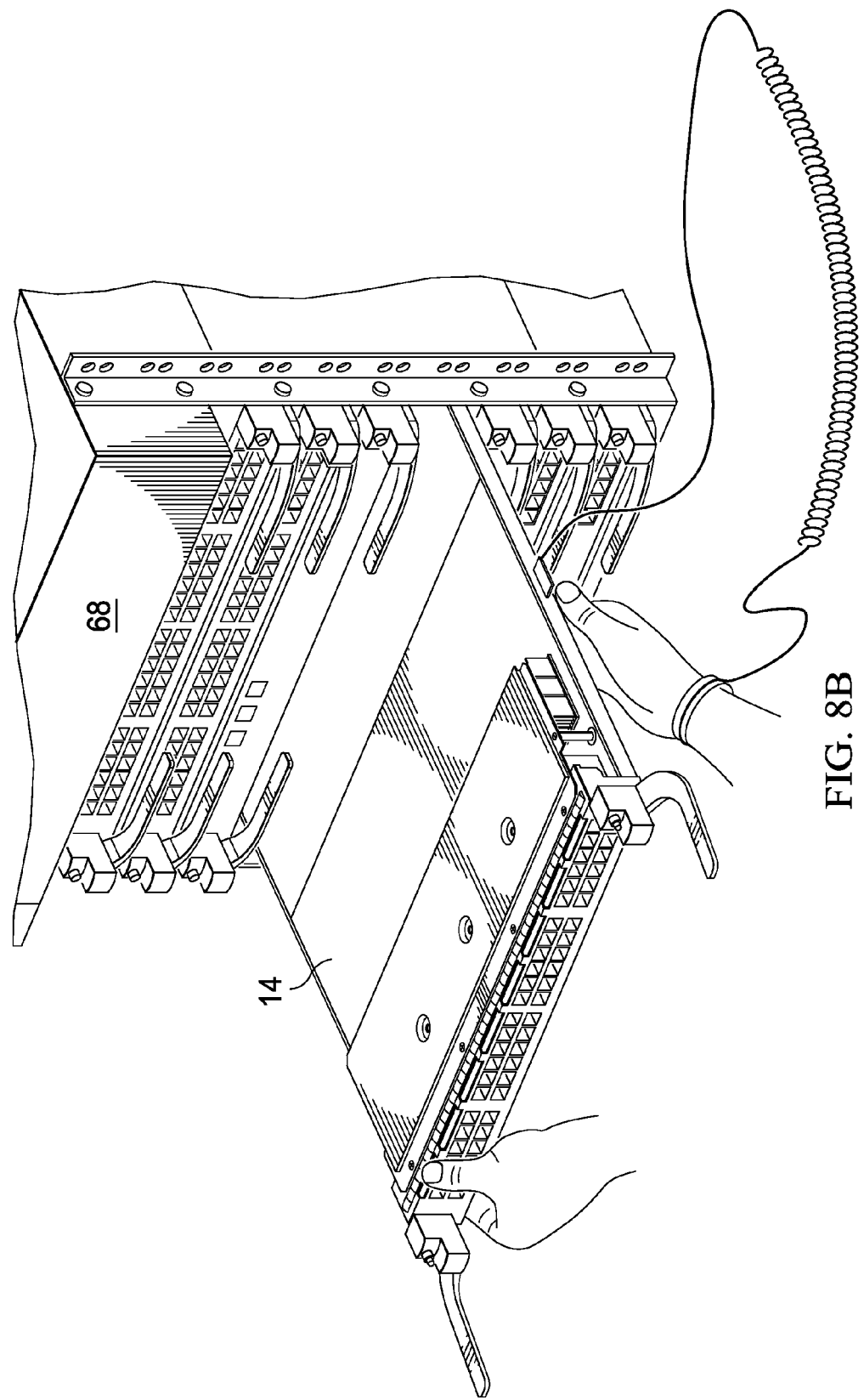

AIR FLOW SYSTEM

TECHNICAL FIELD

This disclosure relates in general to the field of computer and networking systems and, more particularly, to an air flow system for electronic equipment.

BACKGROUND

Over the past several years, information technology (IT) has seen a tremendous increase in performance of electronic equipment, coupled with a geometric decrease in floor space to house the equipment. Further, increased performance requirements have led to increased energy usage, which has resulted in increased heat dissipation within an already-crowded floor space. For example, the rate of increase of heat density for communications equipment was 13% annually from 1992 through 1998, at which time it increased to 28%, and is projected to continue to increase. As a result, data centers are demanding better thermally managed products that have good computing performance coupled with good thermal performance. Thus, there is a need to design electronic equipment with better thermal characteristics.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which:

FIGS. 8A-8C are simplified diagrams illustrating example details of an embodiment of the air flow system;

DETAILED DESCRIPTION OF EXAMPLE EMBODIMENTS

Overview

An apparatus is provided in one example embodiment and includes a faceplate having a plurality of slots arranged on a front portion of the faceplate, a top plate attached to a top portion of the faceplate, and a screen attached to the faceplate and the top plate. A channel may be disposed behind the faceplate and between a bottom surface of the top portion of the faceplate, a bottom surface of the top plate and a top surface of the screen. The screen may include a plurality of openings. In a specific embodiment, the apparatus may be removably attached to a removable line card of a switch.

In a specific embodiment, the top plate may be substantially perpendicular to the front portion of the faceplate, and substantially parallel to the top portion of the faceplate. In another specific embodiment, the screen may be substantially parallel to the top plate. In yet another specific embodiment, the top plate may be a substantially solid plate. In still another embodiment, the top plate and the screen may extend along a portion of a length of the line card. The faceplate can include a plurality of openings to accommodate ports in the line card.

In a specific embodiment, air may be guided through the slots, along the channel and through the plurality of openings to one or more heat generating components on the line card. The air may be guided through the slots by a fan operating behind the apparatus. In other example embodiments, the apparatus can include a switch with a plurality of line cards, each line card having modular air flow assembly on a front of the line card, with the modular air flow assembly including the faceplate, the top plate and the screen.

Example Embodiments

Figure 1:
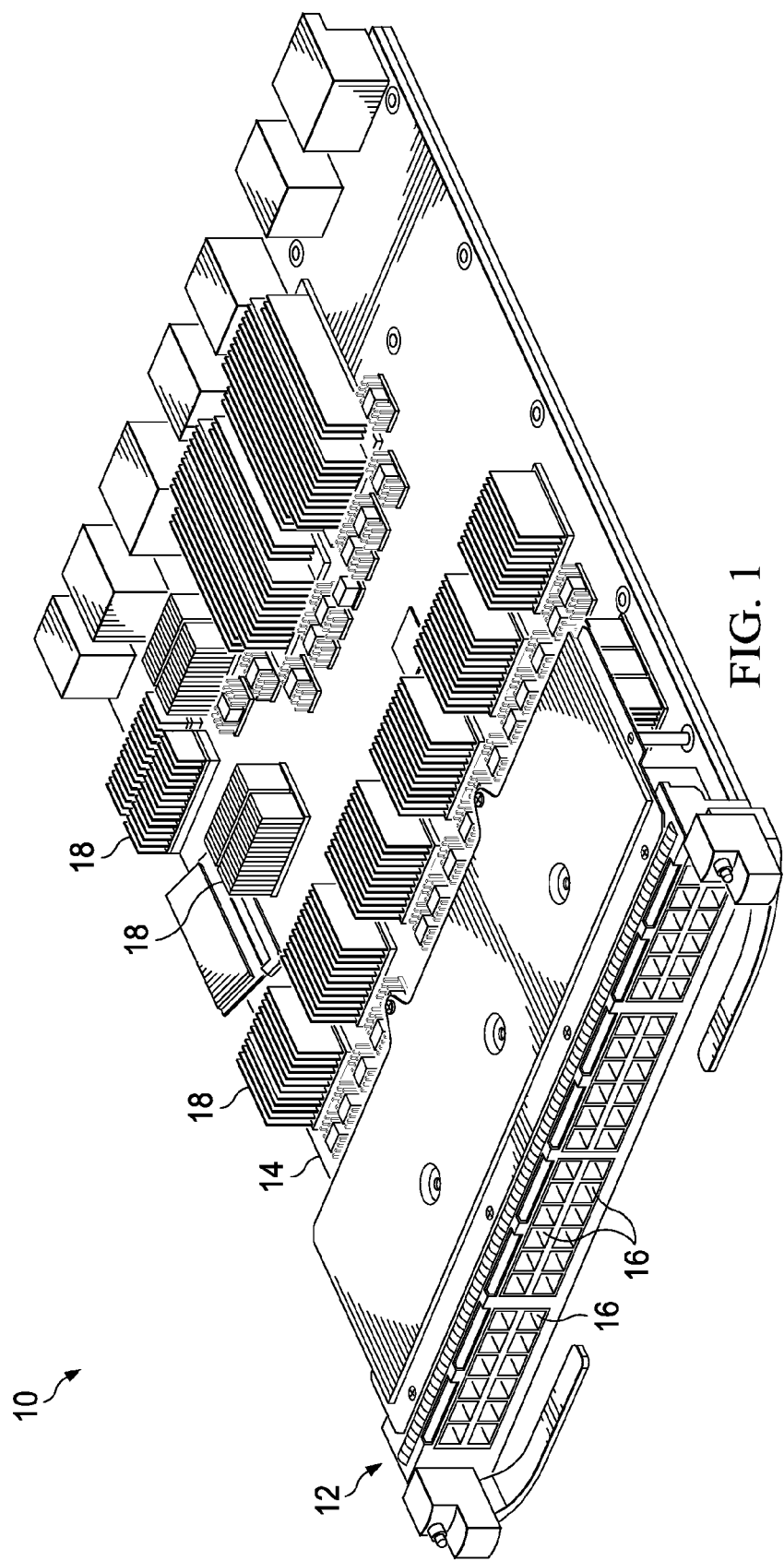
FIG. 1 is a simplified block diagram illustrating an air flow system according to an example embodiment.

Turning to FIG. 1, FIG. 1 is a simplified diagram illustrating a perspective view of an air flow system 10 in accordance with one example embodiment. Air flow system 10 includes a modular air flow assembly 12 on a line card 14. As used herein, the term "line card" refers to any electronic equipment that includes an electronic circuit (e.g., on a printed circuit board) to communicate data in a network. "Electronic equipment" can include any equipment (e.g., instrument that performs a task) that includes electronic circuitry, such as computers, switches/routers, line cards, smartphones, motherboards, etc. In a specific embodiment, line card 14 may be removably attached to a switch (or router). The terms "switch" and "router" may be interchangeably used in this Specification to refer to devices that receive and forward packets in the network.

In specific embodiments, line card 14 may include a plurality of ports 16 (e.g., ports serve as entry and exit points of data in the switch). In a more specific embodiment, ports 16 may be configured with high port density (e.g., large number of ports in a relatively small area). Each of ports 16 indicates an opening, to which a networking cable (e.g., Ethernet cable, fiber optic cable, etc.) can be plugged using a suitable connector (e.g., RJ45 connector, SFP connector, etc.).

Line card 14 may include a plurality of heat generating components 18. Heat generating components 18 may include any type of electrical circuits, for example, power supplies, signal processors and other semiconductor chips, resistors, memory elements, etc. According to various embodiments, removable modular air flow assembly 12 can improve airflow without sacrificing electromagnetic interference (EMI) shielding performance in air flow system 10.

For purposes of illustrating the techniques of air flow system 10, it is important to understand the constraints in a given system such as the system shown in FIG. 1. The following foundational information may be viewed as a basis from which the present disclosure may be properly explained. Such information is offered earnestly for purposes of explanation only and, accordingly, should not be construed in any way to limit the broad scope of the present disclosure and its potential applications.

Most modern communications equipment includes heat generating electronic components that have to be cooled to enable them to perform effectively. Typically, the electronic components are cooled using air that is forced into the equipment chassis and made to flow over the electronic components. In data center environments with large number of electronic components, thermal management can be a challenge. Some data centers utilize a hot aisle/cold aisle layout design for server racks and other computing equipment to conserve energy and lower cooling costs by managing air flow effectively.

In its simplest form, a hot aisle/cold aisle data center design involves lining up server racks in alternating rows with cold air intakes facing one way and hot air exhausts facing another way. The rows composed of rack fronts are called cold aisles. Typically, cold aisles face air conditioner output ducts. The rows, into which heated exhausts pour, are called hot aisles. Typically, hot aisles face air conditioner return ducts. Cool air thus enters at the front, and hot air exits at the back.

Equipment used in such hot aisle/cold aisle data centers may have front-to-back airflow cooling. For example, in a switch comprising a plurality of line cards, the air enters at a front panel faceplate of each individual line card, passes through a mid-plane of the line card, and exits at the back of the switch chassis. The front panel includes perforations, which permit air to enter the chassis. The perforation area can affect board-level (e.g., at the line card level) and system-level (e.g., at the switch chassis level) cooling. However, port density of the line-cards is already quite high, and expected to increase in the future. The increasing number of ports on the faceplate and the limited total exposed area of the faceplate present a challenge in configuring the perforations on the front panel faceplate. Additionally, the power dissipation and cooling demands are increased proportional to the port density. However, with the increased port density, the perforation area is reduced. Thus, the cooling capacity of the line card is reduced.

Moreover, EMI shielding is a consideration in such thermal management systems. EMI refers to disturbance that affects an electrical circuit due to either electromagnetic induction or electromagnetic radiation emitted from an external source. The disturbance may interrupt, obstruct, or otherwise degrade the effective performance of the electrical circuit. The degradation can range from a simple loss of quality data to a total data loss. In general, metallic materials can block the magnetic field that gives rise to EMI, thereby providing effective EMI shielding. The amount of shielding depends upon the material used, its thickness, the size of the shielded volume and the frequency of the fields of interest and the size, shape and orientation of apertures in the shield to an incident electromagnetic field.

Typical materials used for electromagnetic shielding include sheet metal, metal screen, and metal foam. Any holes in the shield should be significantly smaller than the wavelength of the radiation that is being kept out, or the shield may not effectively approximate an unbroken conducting surface. For most high frequency applications, aluminum can be a suitable material choice for the EMI shield; for low frequency applications, steel may be more suitable.

A typical choice for the EMI shield where air flow is also a consideration is an EMI venting screen, which includes a sheet of conductive material having holes in a honeycomb pattern. The shielded honeycomb EMI venting screen may be based on at least three criteria: attenuation (e.g., EMI shielding ability), air flow (e.g., how much static pressure drop is introduced into the system), and mounting (e.g., attachment method). EMI shielding is improved with more conductive surface and less number of openings; on the other hand, air flow is improved with higher number of openings. Thus, configuration of a suitable EMI venting screen may involve a tradeoff between EMI shielding and air flow.

Air flow system 10 is configured to address these issues (and others) in offering modular air flow assembly 12 that can improve thermal performance without sacrificing EMI shielding capabilities (among other advantages). Embodiments of air flow system 10 can increase air flow, reduce system resistance (e.g., pressure) and maintain EMI shielding performance. Air flow system 10 can be configured to be contained within line card 14, requiring no extra space or additional area than already used by line card 14. Customizable screens may be configured therein for airflow for each individual line card 14 having different EMI or air flow requirements. Air flow system 10 may not affect the system mechanical/EMI shielding design, but provides improved thermal and airflow performance without sacrificing EMI shielding.

Embodiments of air flow system 10 can include modular air flow assembly 12 having a solid top plate providing an EMI shielding cover, a screen with openings to provide an air flow path, a slotted faceplate that can provide an unrestricted airflow intake channel and an EMI shielding gaskets/foam that can shield off possible EMI leakage between the components of modular air flow assembly 12. In various embodiments, modular air flow assembly 12 may comprise conductive materials that can provide EMI shielding and thermal conduction. Although modular air flow assembly 12 is illustrated and described with reference to line card 14, it may be noted that modular air flow assembly 12 may be installed in other devices (e.g., computers, laptops, etc.) where thermal management, EMI shielding, and small form factor (e.g., reduced surface area to place air flow vents) can be particular considerations in design choices.

Note that the numerical and letter designations assigned to the elements of FIG. 1 do not connote any type of hierarchy; the designations are arbitrary and have been used for purposes of teaching only. Such designations should not be construed in any way to limit their capabilities, functionalities, or applications in the potential environments that may benefit from the features of air flow system 10. It should be understood that the air flow system 10 shown in FIG. 1 is simplified for ease of illustration.

Figure 2:
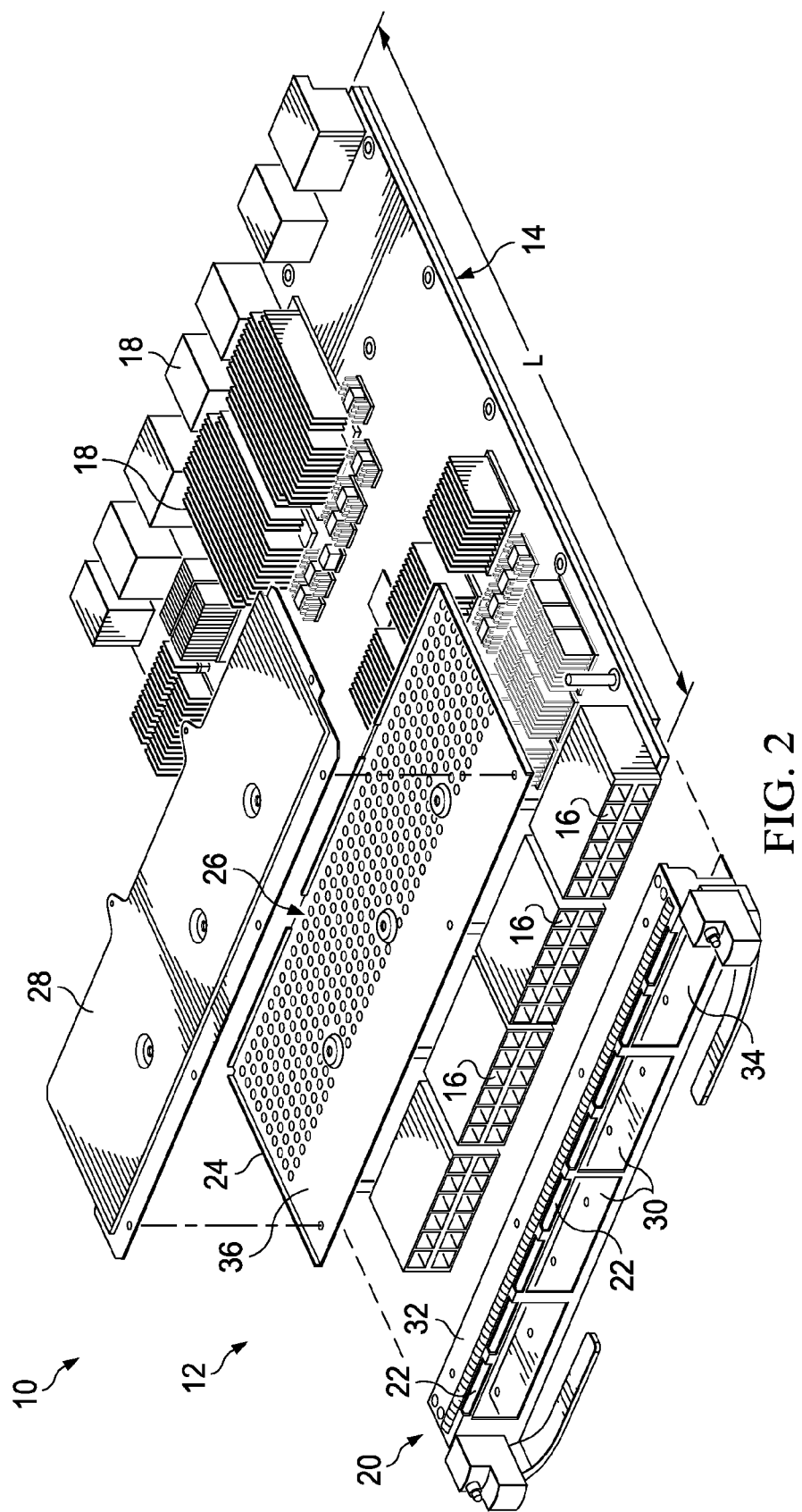
FIG. 2 is a simplified diagram illustrating an exploded view of the air flow system in accordance with one embodiment.

Turning to FIG. 2, FIG. 2 is a simplified diagram showing an exploded view of an embodiment of air flow system 10. Modular air flow assembly 12 may include a faceplate 20 comprising a plurality of slots 22 arranged on a front portion thereof; a screen 24, comprising a plurality of openings 26; and a top plate 28, comprising a substantially solid plate. The term "slot" can include an aperture that is relatively longer than it is wide. In various embodiments, top plate 28 may be detachably attached (e.g., using screws) to faceplate 20 and screen 24. In other embodiments, top plate 28 may be permanently attached (e.g., welded, brazed, etc.) to faceplate 20 and screen 24. In a specific embodiment, modular air flow assembly 12 may be detachable from line card 14, for example, to facilitate inspecting, or repairing components thereon.

Faceplate 20 may include openings 30 on the front portion to accommodate ports 16. Faceplate 20 may include a top portion 32 and a bottom portion 34. Top portion 32 may facilitate supporting and attaching top plate 28 to faceplate 20 with screws or other attachment mechanisms. In a specific embodiment, top portion 32 may be substantially perpendicular to the front portion of faceplate 20, and parallel to bottom portion 34. Top plate 26 also may be substantially perpendicular to the front portion of faceplate 20, and parallel to bottom portion 34. Bottom portion 34 may facilitate attaching faceplate 20 to line card 14.

Screen 24 may have a top surface 36 that includes a solid portion, and another portion with plurality of openings 26. Screen 24 may also include features (e.g., screw holes, etc.) to detachably attach it to top plate 28. In some embodiments, modular air flow assembly 12 may extend a length L of line card 14 (where L is measured perpendicular to the front portion of faceplate 20). In other embodiments, as illustrated in the FIGURE, modular air flow assembly 12 may extend along a portion of length L. In various embodiments, faceplate 20 may include additional features that may be applicable to various pluggable line card functionalities of line card 14, such as levers and locking mechanisms to attach line card 14 to a switch or router.

Figure 3:
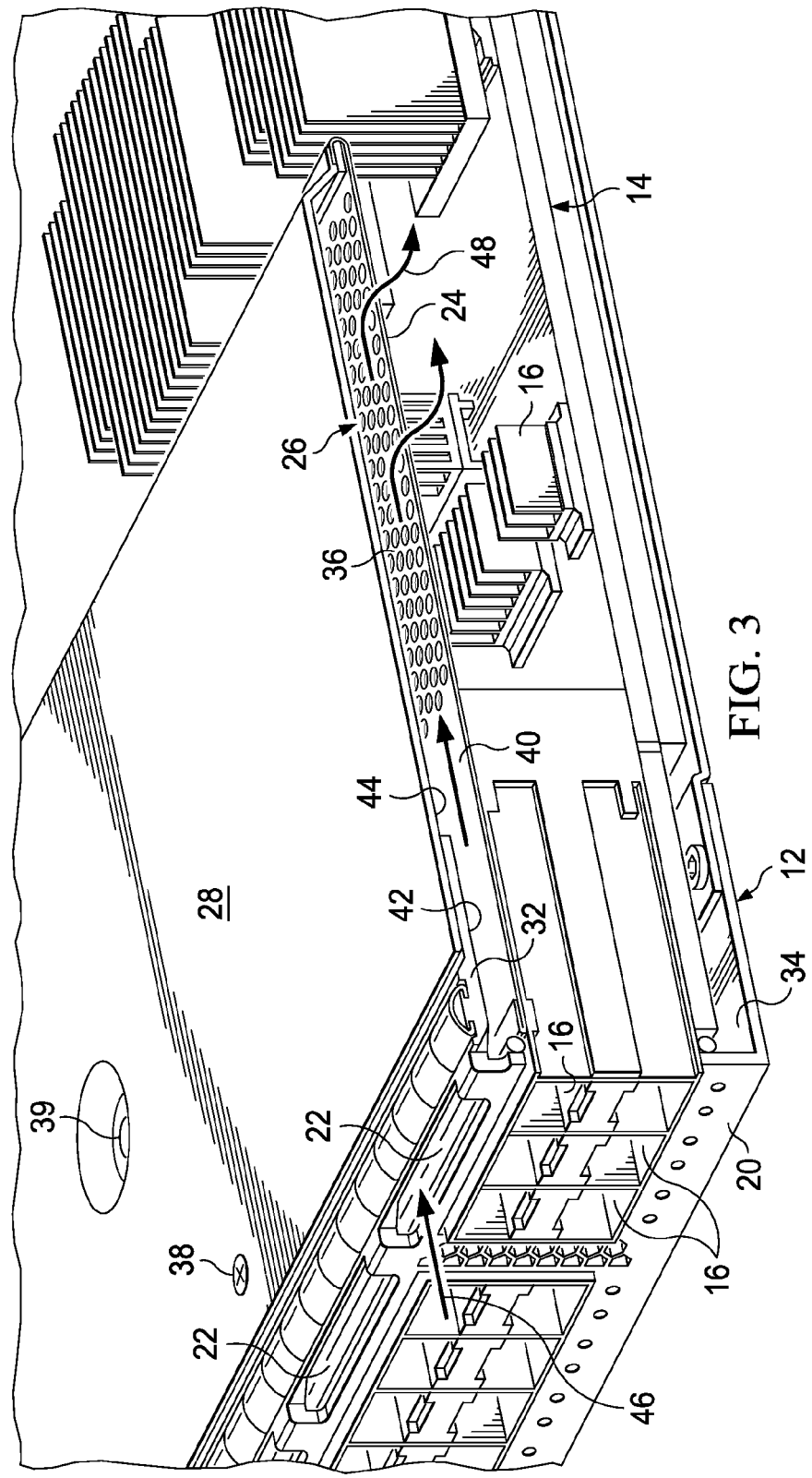
FIG. 3 is a simplified diagram illustrating example details associated with an example embodiment of the air flow system.

Turning to FIG. 3, FIG. 3 is a simplified diagram showing a cut-out of example details of an embodiment of air flow system 10. Faceplate 20 may be attached to top plate 26, for example, with screws 38 (or other suitable attachment mechanism). Top plate 28 may be attached to screen 24 with screws 39 (or other suitable mechanism). In an assembled configuration (e.g., where top plate 28 is attached to faceplate 20 and screen 24), modular air flow assembly 12 may provide a channel 40 for air flow into line card 14.

According to various embodiments, channel 40 may be disposed behind faceplate 20, and between faceplate 20, top plate 28 and screen 24. For example, channel 40 may be disposed behind the front portion of faceplate 20, and between a bottom surface 42 of top portion 32 of faceplate 20, a bottom surface 44 of top plate 28 and top surface 36 of screen 24. Channel 40 may extend from behind the front portion of faceplate 20 to the opposite end of screen 24.

According to various embodiments, air may be guided through slots 22, along channel 40 and through plurality of openings 26 to one or more heat generating components 18 on line card 14. Air may be guided into a front of line card 14 in a direction indicated by arrow 46 through vents 22. Air may flow through channel 40 and through plurality of openings 26 in screen 24, in a direction generally indicated by arrow 48. Portions of the air may flow substantially parallel to top plate 28, and then bend away (e.g., downwards, or sideways) through openings 26. Thus, air may be guided adjacent to (e.g., near, over, around) heat generating components 16 on line card 14. The air may eventually exit line card 14 at a back (or side portion), thus enabling a front-to-back air cooling system. In various embodiments, a fan (not shown) operating behind line card 14 may pull in air and push it out of the back of line card 14.

Figure 4:
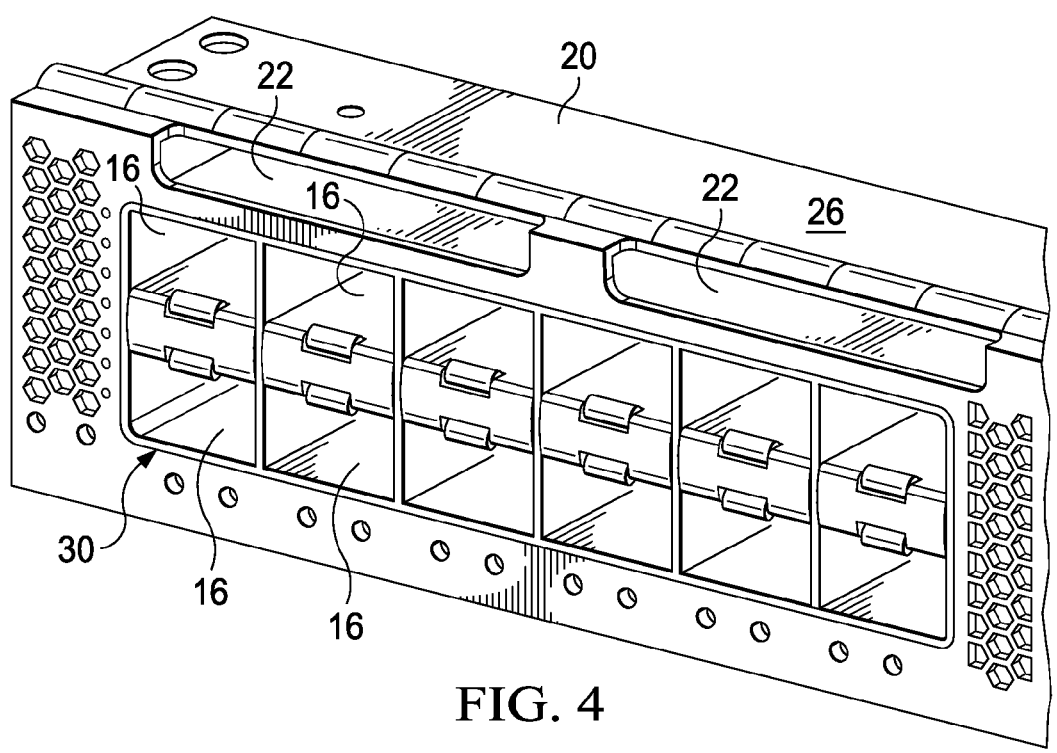
FIG. 4 is a simplified diagram illustrating other example details of the air flow system in accordance with an embodiment.

Turning to FIG. 4, FIG. 4 is a simplified diagram showing a close-up view of some example details of air flow system 10. Faceplate 20 includes openings 30 to accommodate connectors to ports 16, and slots 22 for channeling air through air flow system 10. It should be noted that the openings illustrated in the figure corresponding to ports 16 are not open all the way through (e.g., to accommodate electronic circuitry of ports 16), and therefore, do not provide any air flow. Moreover, when line card 14 is operational in a suitable switch or router, some or all of the openings for ports 16 can be closed up with appropriate connectors. In various embodiments, slots 22 may be joined to create a single slot extending through the length of faceplate 20. However, EMI shielding in such a configuration may be proportionately lower.

Figure 5A:
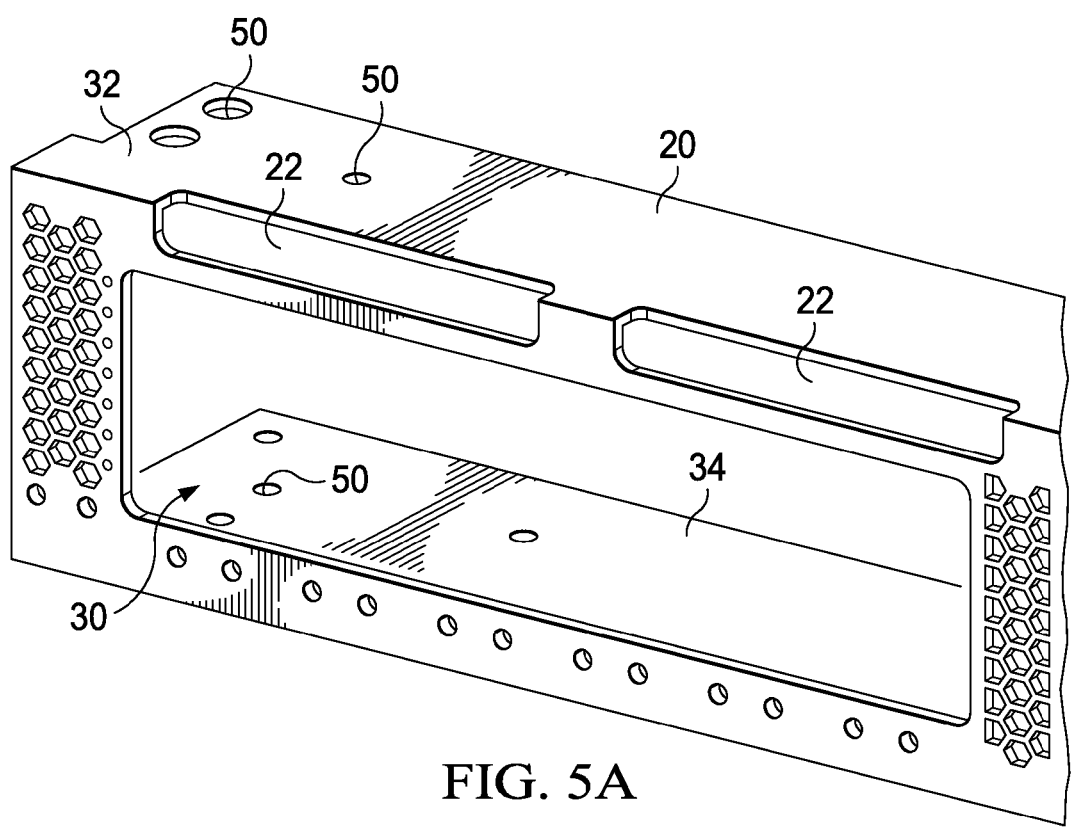
FIGS. 5A-5D are simplified diagrams illustrating example details of an embodiment of the air flow system.
Figure 5B:
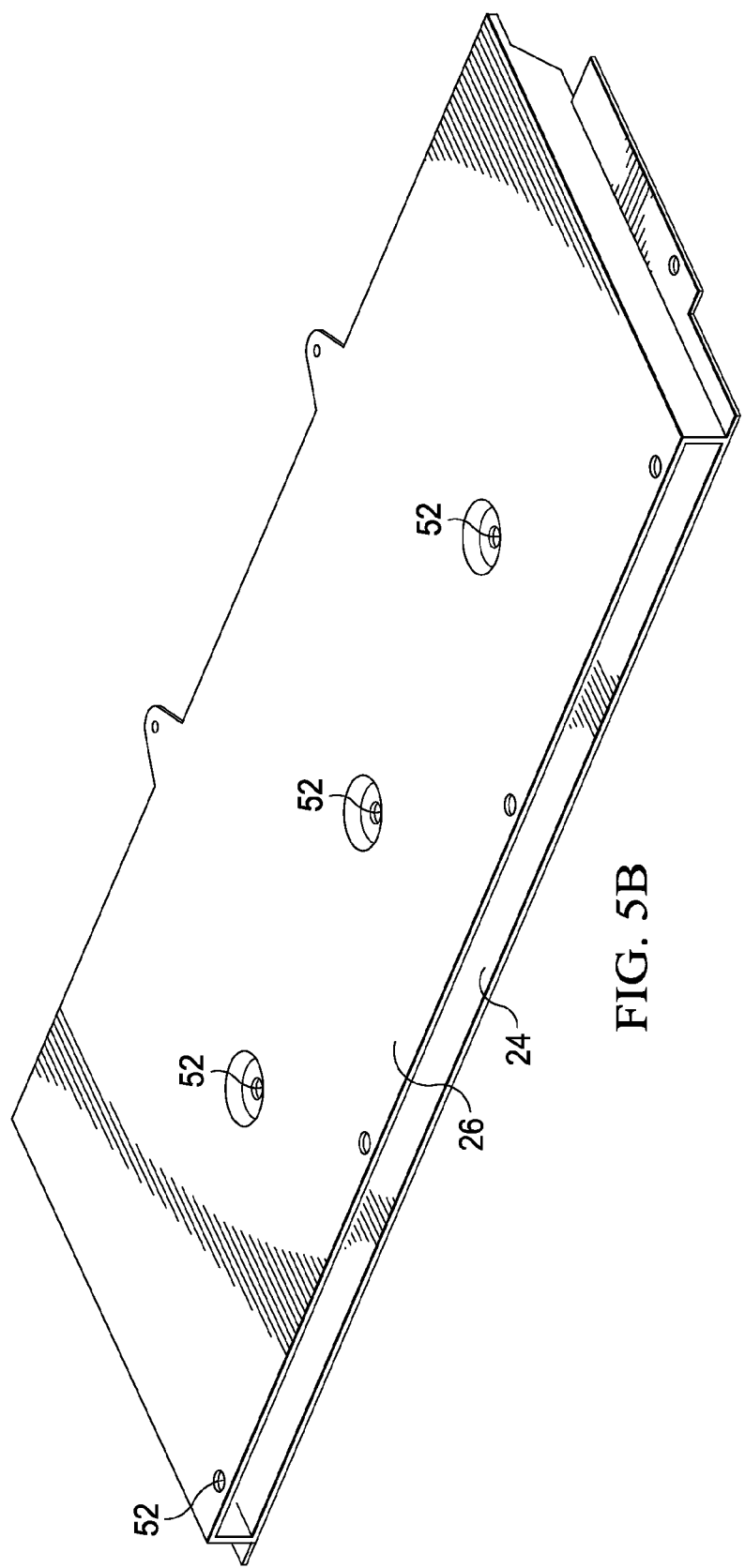

Turning to FIGS. 5A-5D, FIGS. 5A-5D are simplified diagrams illustrating individual components of modular air flow assembly 12. In FIG. 5A, faceplate 20 may include opening 30 to accommodate connectors (e.g., RJ45 connectors or SFP connectors, etc.) corresponding to ports 16 (not shown) and slots 22 that can facilitate air flow into line card 14. Top portion 32 and bottom portion 34 may include attachment means 50 (e.g., holes, threaded holes, etc.) to attach faceplate 20 to top plate 28 and line card 14. In FIG. 5B, top plate 28 may include a substantially solid portion comprising a flat plate and attachment means 52 (e.g., threaded holes, holes, etc.) to attach it to faceplate 20 and screen 24. In some example embodiments, attachment means 52 may include screw holes with appropriate indentations to permit top plate 28 to be screwed to EMI venting plate 24.

Figure 5C:
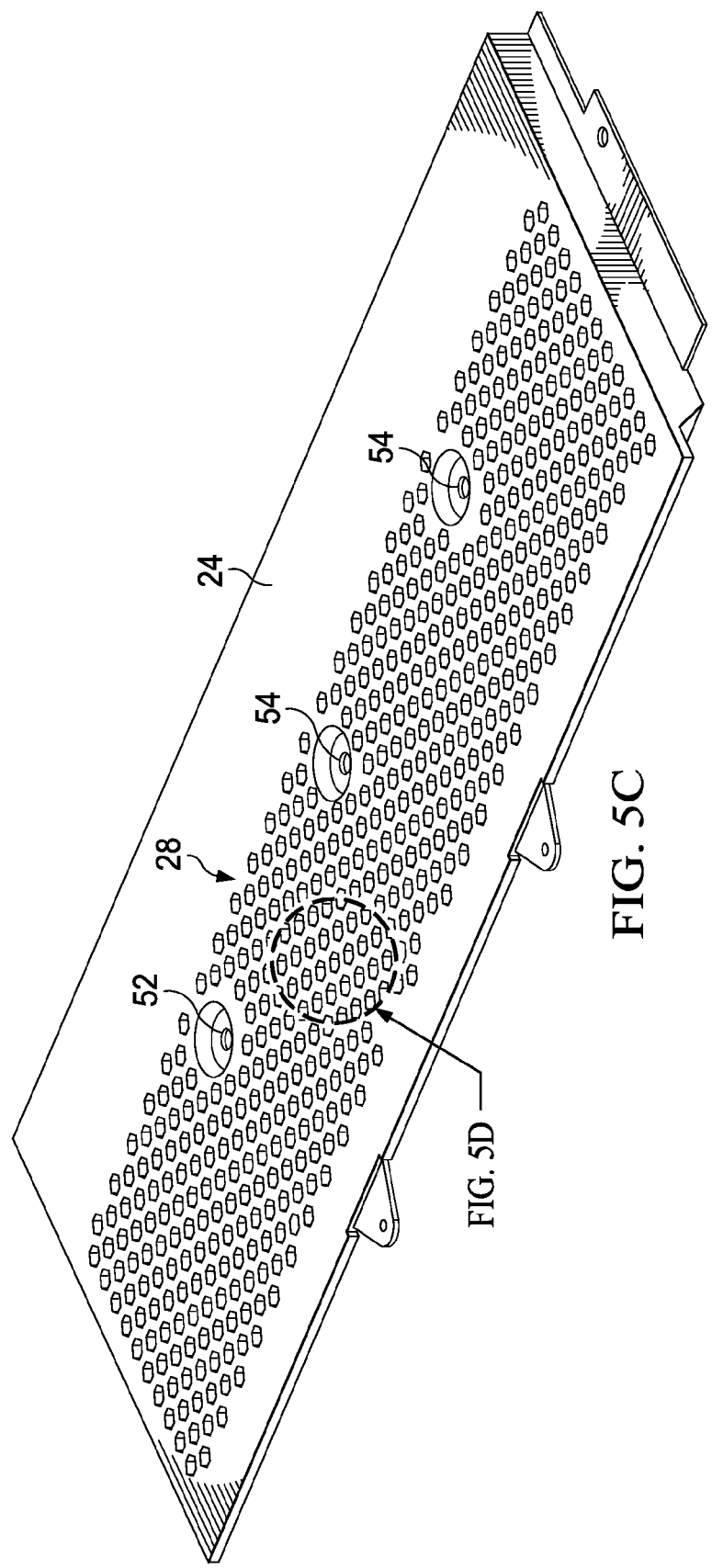

In FIG. 5C, screen 24 is illustrated showing attachment means 54 (e.g., threaded holes, holes, etc.) to attach it to top plate 26. In various embodiments, plurality of openings 26 may be of any shape and size to meet EMI and air flow requirements, as needed. The number, size, and shape of openings 26 may affect the degree to which screen 24 provides EMI shielding. Nevertheless, top plate 26 may provide sufficient EMI shielding so that screen 24 may be suitably configured to permit maximum air flow through channel 40, rather than effective EMI shielding.

Figure 5D:
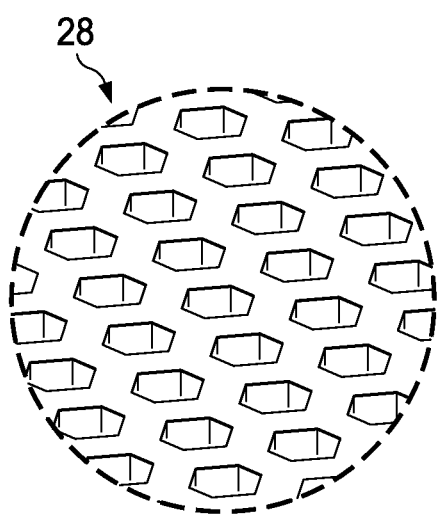

A close-up of openings 28 is also illustrated in FIG. 5D. In some embodiments, openings 28 may be a hexagonal honeycomb structure configured to improve EMI shielding characteristics. For example, an electromagnetic wave may be reflected off the walls in each hexagonal tube, and a portion of the wave may be absorbed into the material, leading to reduction in EMI leakage. In another example, openings 28 may be circular (or any other shaped) holes that permit suitable air flow through screen 24. For example, openings 28 may be configured to enable smooth air flow, rather than reduced EMI emission. In some embodiments, screen 24 may include suitable EMI gaskets that prevent EMI leakage when screen 24 is mounted on line card 14.

Figure 6A:
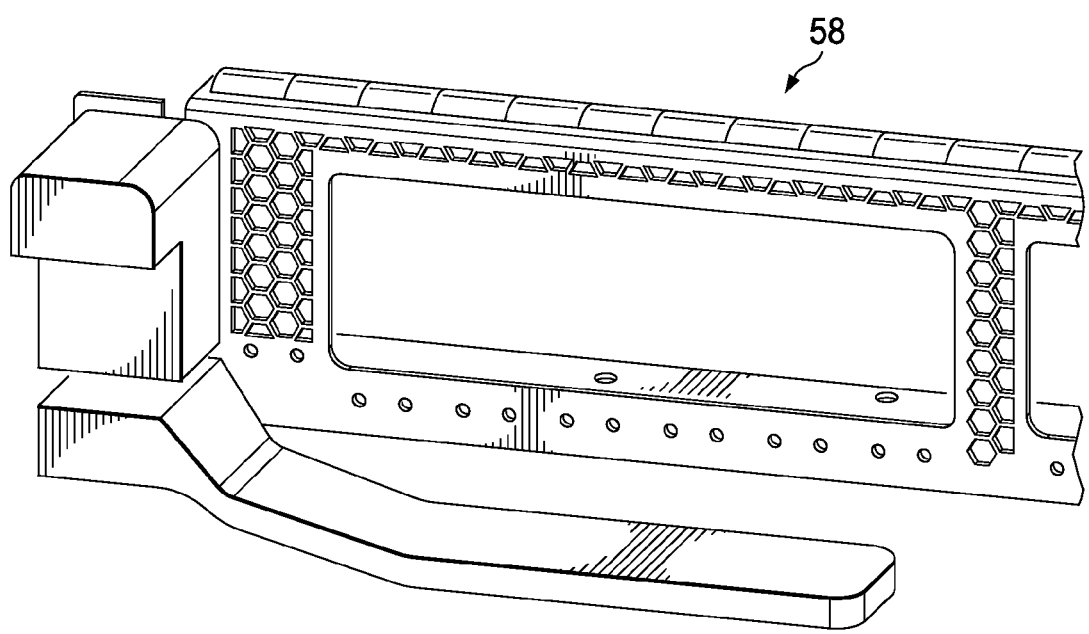
FIGS. 6A-6B are simplified diagrams illustrating example details of experimental configurations related to the air flow system.
Figure 6B:
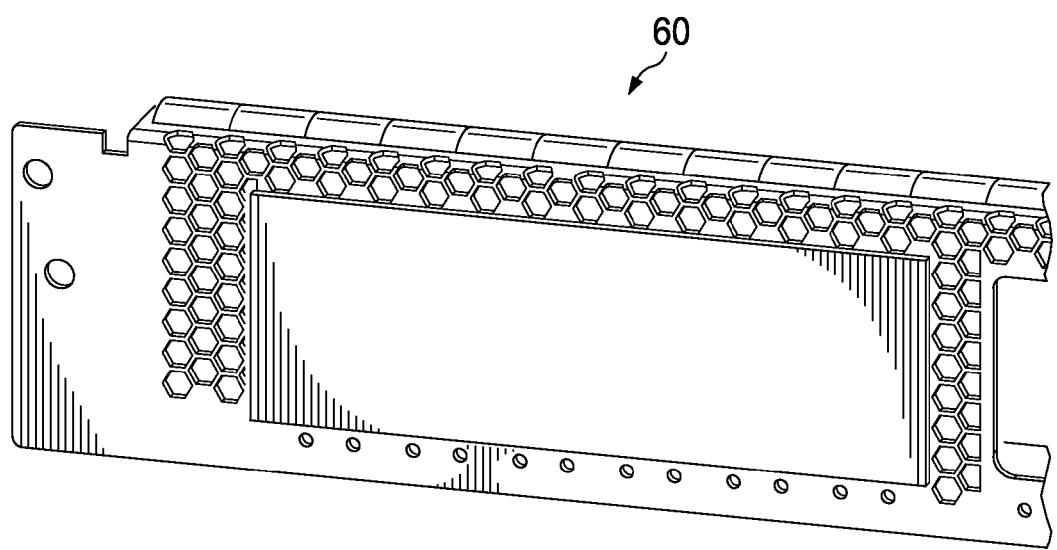

Turning to FIGS. 6A-6B, FIGS. 6A-6B illustrate example configurations of experimental setups related to air flow system 10. CONFIG 1, indicated as 58 in FIG. 6A, includes a machined faceplate with no top plate or screen. CONFIG 2, indicated as 60 in FIG. 6B, includes a sheet metal with 55% perforations and holes on the edges. Air was guided through the faceplates in the two different configurations, and air flow (in cubic feet per minute (CFM)) was measured and compared with modular air flow assembly 12 according the present disclosure.

Figure 7:
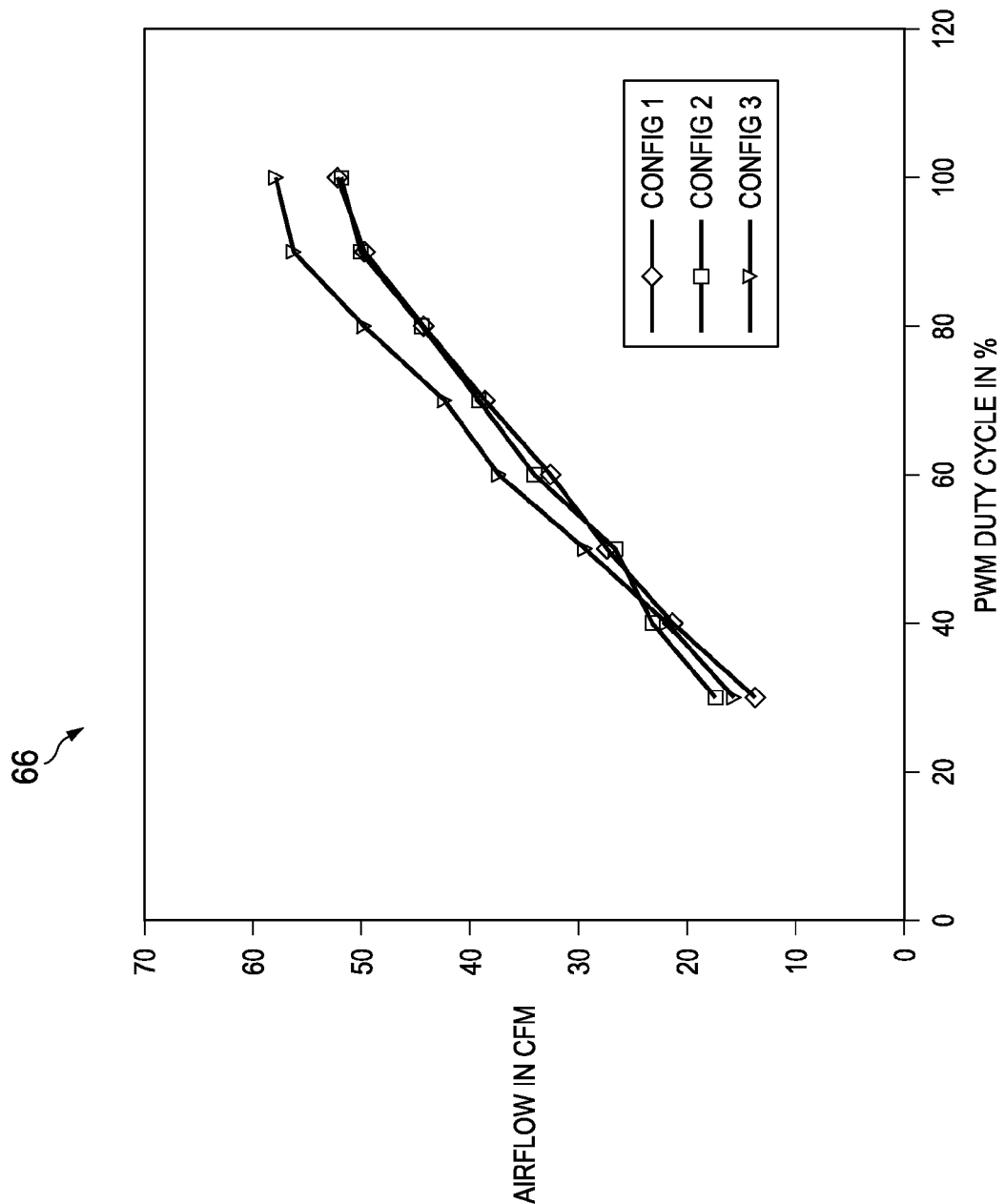
FIG. 7 is a simplified diagram illustrating a graphical comparison of air flow versus duty cycle.

Turning to FIG. 7, FIG. 7 is a simplified diagram illustrating a graphical comparison 66 between the airflow measured in the different configurations described with reference to FIGS. 6A, 6B and FIG. 1. The X-axis represents the pulse width modulation (PWM) duty cycle in % indicating the power of an electrically powered fan that facilitates guiding air through line card 14. For PWM duty cycles greater than 50%, CONFIG 3, representing modular air flow assembly 12, shows better airflow compared to the other configurations.

Figure 8A:
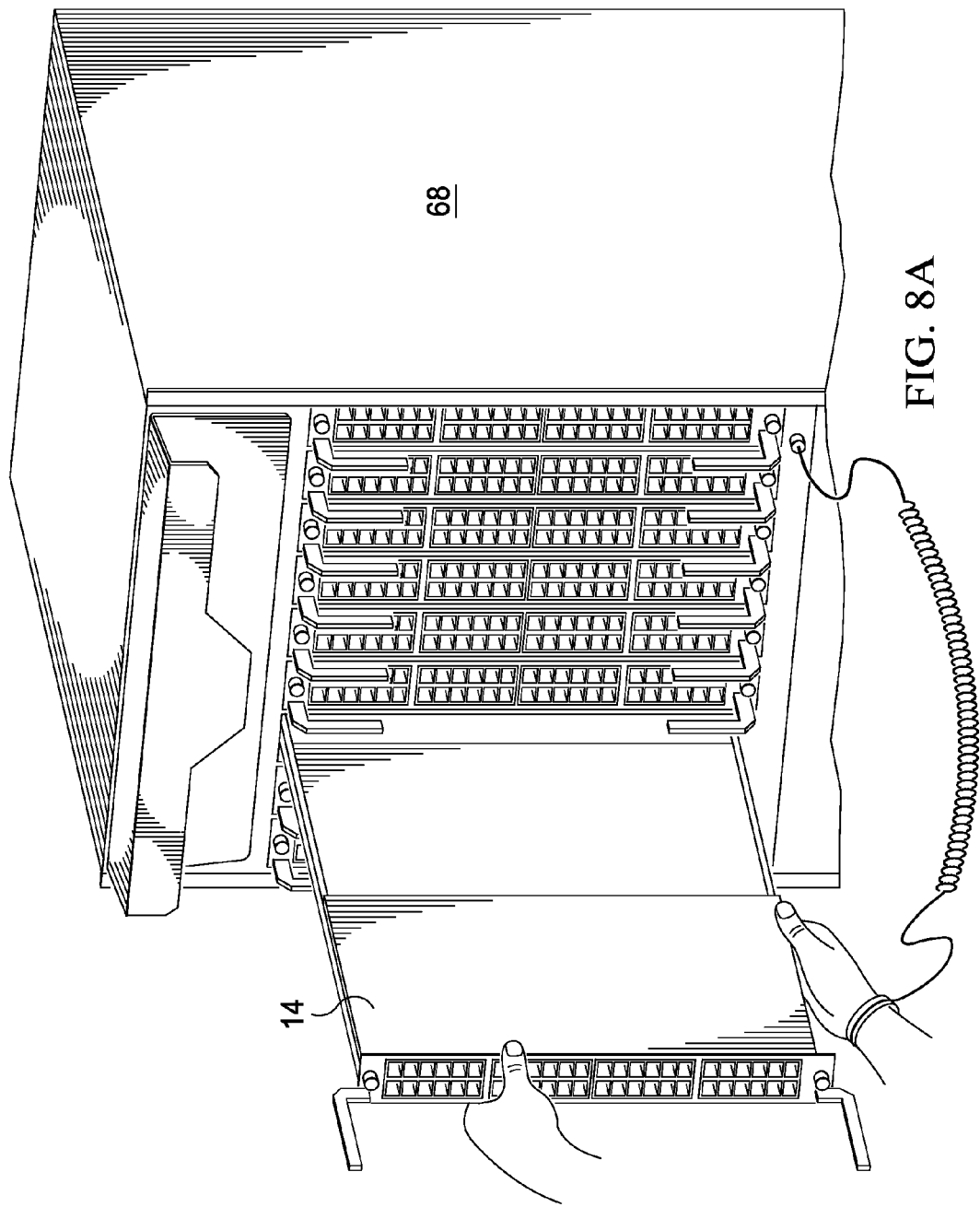
Figure 8C:
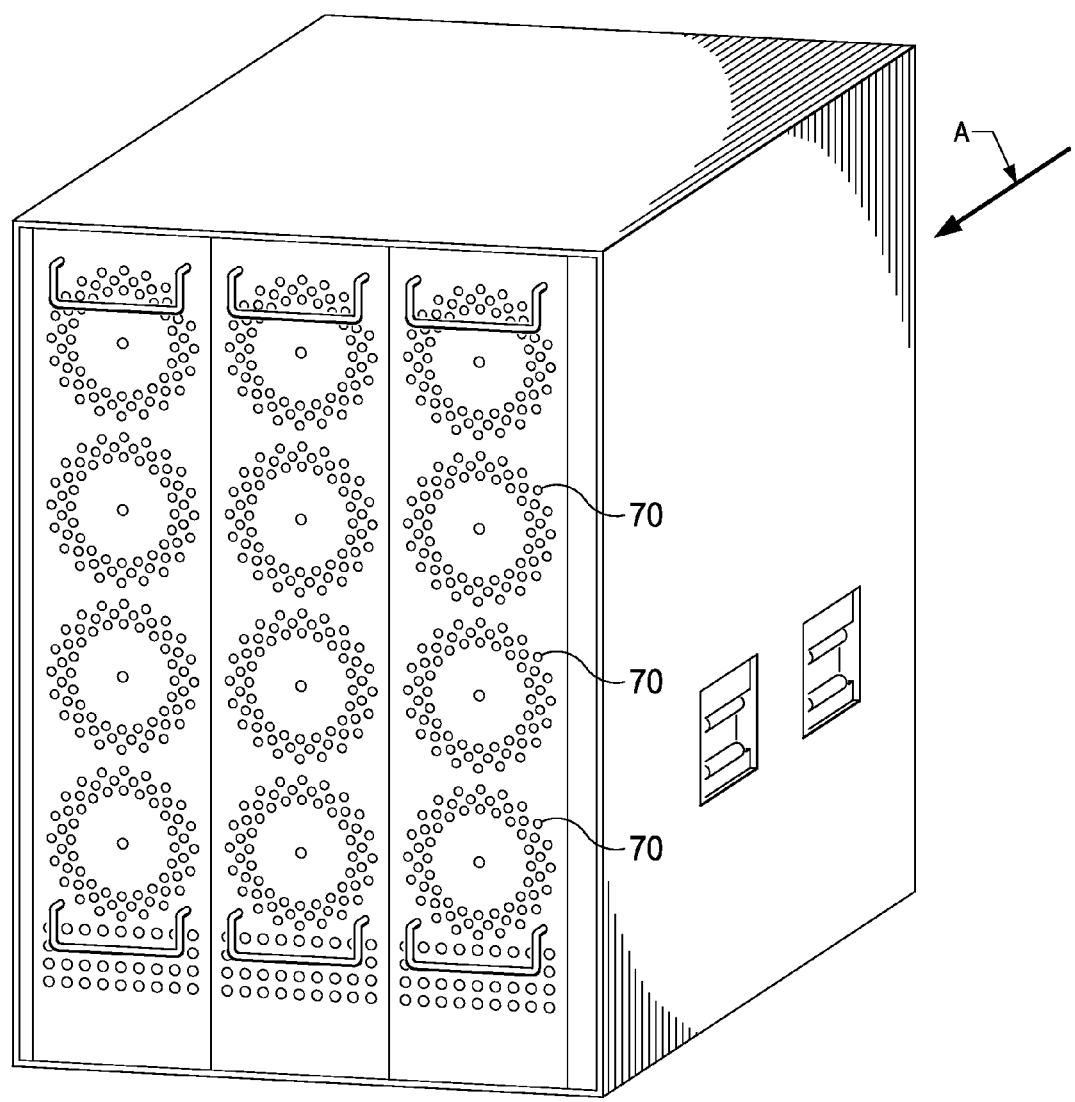

Turning to FIGS. 8A-8C, FIGS. 8A-8C are simplified diagrams illustrating line card 14 in switch 68 according to various configurations. In some embodiments, as illustrated in FIG. 8A, line card 14 may be turned vertically and guided out of a slot in switch 68. Captive screws on faceplate 20 may be loosened, ejector levers pivoted to unlock line card 14, and line card 14 may be slid out of the chassis of switch 68. In other embodiments, as illustrated in FIG. 8B, line card 14 may be placed horizontally in switch 68. Any suitable arrangement may be implemented, with front-to-back air cooling facilitated appropriately by air flow system 10 in line card 14.

In various embodiments, as illustrated in FIG. 8C, switch 68 may include one or more fans 70 (shown via holes behind the fans) behind line cards 14 in switch 68. During operation, fans 70 may pull in air from a front of switch 68, as indicated by arrow A. Air may flow through slots 22, channel 40, and through openings 28 in modular air flow assembly 12 of each line card 14, over heat generating components 18 of each line card 14, and exit out of a back of switch 68.

Figure 9:
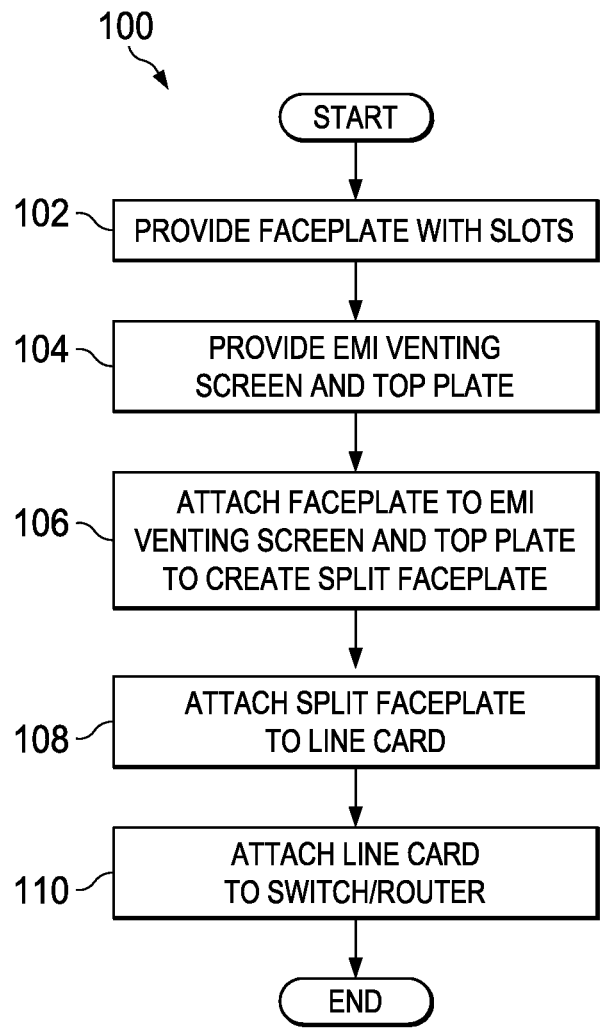
FIG. 9 is a simplified flow diagram illustrating example operations that may be associated with an embodiment of the air flow system.

Turning to FIG. 9, FIG. 9 is a simplified flow diagram illustrating example operations that may be associated with an embodiment of air flow system 10. Operations 100 may include 102, at which faceplate 20 with slots 22 may be provided. At 104, screen 24 and top plate 28 may be provided. At 106, faceplate 20 may be attached to screen 24 and top plate 28 to create modular air flow assembly 12. At 108, modular air flow assembly 12 may be attached to line card 14. At 110, line card 14 may be attached to switch 68.

Figure 10:
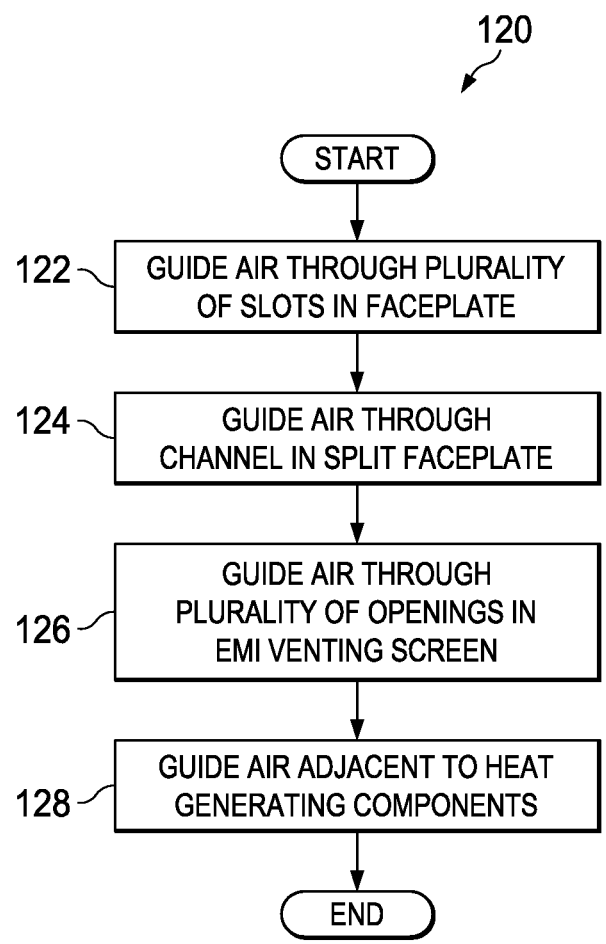
FIG. 10 is a simplified flow diagram illustrating other example operations that may be associated with an embodiment of the air flow system.

Turning to FIG. 10, FIG. 10 is a simplified flow diagram illustrating example operations that may be associated with an embodiment of air flow system 10. Operations 120 may include 122, at which air may be guided through plurality of slots 22 in faceplate 20. At 124, air may be guided through channel 40 in modular air flow assembly 12. At 126, air may be guided through plurality of openings 26 in screen 24. At 128, air may be guided adjacent to (e.g., near, over, under, around, etc.) heat generating components 18.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

It is imperative to note that countless possible design configurations can be used to achieve the operational objectives outlined here. Accordingly, the associated infrastructure of air flow system 10 may have a myriad of substitute arrangements, design choices, device possibilities, hardware configurations, equipment options, etc. It is also important to note that the operations and steps described with reference to the preceding figures illustrate only some of the possible scenarios that may be executed by, or within, the system. Some of these operations may be deleted or removed where appropriate, or these steps may be modified or changed considerably without departing from the scope of the discussed concepts.

In addition, the timing of these operations may be altered considerably and still achieve the results taught in this disclosure. The preceding operational flows have been offered for purposes of example and discussion. Substantial flexibility is provided by the system in that any suitable arrangements, chronologies, configurations, and timing mechanisms may be provided without departing from the teachings of the discussed concepts.

Although the present disclosure has been described in detail with reference to particular arrangements and configurations, these example configurations and arrangements may be changed significantly without departing from the scope of the present disclosure. For example, although the present disclosure has been described with reference to a line card, air flow system 10 may be applicable to other devices where a similar tradeoff between EMI shielding and air flow may be desired. In some embodiments, top plate 26 may be provided for aesthetic reasons, or to protect components underneath. In other embodiments, considerations other than EMI shielding or air flow may drive a similar configuration. All such scenarios are included within the broad scope of the embodiments disclosed herein.

In various embodiments, the elements of air flow system 10 may be composed of any kind of materials, including metal, plastic, wood, fiber glass, semiconductors, etc., or a combination thereof. In a specific embodiment, modular air flow assembly 12 may be composed of metallic materials, such as aluminum or steel. While metallic materials may be applicable to considerations of EMI, in devices where EMI is not a consideration, any suitable material, including metallic materials may be used.

While screws and similar attachment mechanisms are illustrated in the figures, it may be noted that any kind of attachment mechanisms may be used, including clips, latches, grooves, or other mating and connection devices. In embodiments where the components are removably attached to each other, the attachment mechanisms may be appropriately configured to enable the components to be removed as needed. In other embodiments, where the components are permanently attached to each other, the attachment mechanisms may be appropriately configured to disable separation between the components without destroying them. Examples of such permanent attachment mechanisms include welding, brazing, gluing, etc.

In terms of the dimensions of the articles discussed herein (e.g., the fan, the plate, the pattern, etc.), any suitable length, width, and depth (or height) may be used and can be based on particular end user needs, or specific elements to be addressed by the apparatus (or the system in which it resides). It is imperative to note that all of the specifications and relationships outlined herein (e.g., height, width, length, hole diameter, # holes per unit of area, etc.) have only been offered for purposes of example and teaching only. Each of these data may be varied considerably without departing from the spirit of the present disclosure, or the scope of the appended claims. The specifications apply only to one non-limiting example and, accordingly, should be construed as such. Along similar lines, the materials used in constructing the articles can be varied considerably, while remaining within the scope of the present disclosure.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph six (6) of 35 U.S.C. section 112 as it exists on the date of the filing hereof unless the words "means for" or "step for" are specifically used in the particular claims; and (b) does not intend, by any statement in the specification, to limit this disclosure in any way that is not otherwise reflected in the appended claims.

What is claimed is:

1. An apparatus, comprising:
    a faceplate having a plurality of slots arranged on a front portion of the faceplate;
    a top plate attached to a top portion of the faceplate; and
    a screen attached to the faceplate and the top plate, wherein a channel is disposed behind the faceplate and between a bottom surface of the top portion of the faceplate, a bottom surface of the top plate and a top surface of the screen, wherein the screen comprises a plurality of openings, and wherein the apparatus is removably attached to a removable line card of a switch.

2. The apparatus of claim 1, wherein the top plate is substantially perpendicular to the front portion of the faceplate, and substantially parallel to the top portion of the faceplate.

3. The apparatus of claim 1, wherein the screen is substantially parallel to the top plate.

4. The apparatus of claim 1, wherein the top plate comprises a substantially solid plate.

5. The apparatus of claim 1, wherein the faceplate includes a plurality of openings to accommodate ports in the line card.

6. The apparatus of claim 1, wherein the top plate and the screen extend along a portion of a length of the line card.

7. The apparatus of claim 1, wherein the slots are configured such that air is guided through the slots, along the channel and through the plurality of openings to one or more heat generating components on the line card.

8. The apparatus of claim 7, wherein a fan is configured to guide the air through the slots.

9. An apparatus comprising:
a switch;
a plurality of line cards removably attached and electrically connected to the switch; and
a modular air flow assembly on a front of each line card, wherein the modular air flow assembly comprises:
a faceplate having a plurality of slots arranged on a front portion of the faceplate;
a top plate attached to a top portion of the faceplate; and
a screen attached to the faceplate and the top plate, wherein a channel is disposed behind the faceplate and between a bottom surface of the top portion of the faceplate, a bottom surface of the top plate and a top surface of the screen, wherein the screen comprises a plurality of openings.

10. The apparatus of claim 9, further comprising:
a fan disposed behind the line cards such that air can be pulled in through the slots on the front portion of the faceplate of the line cards, through the channel, through the openings in the screen, and adjacent to one or more heat generating components on the line cards.

11. The apparatus of claim 9, wherein the top plate and the screen extend along a portion of a length of the line cards.

12. The apparatus of claim 9, wherein the faceplate includes a plurality of openings to accommodate ports on the line cards.

13. A method, comprising:
guiding air through a channel in a modular air flow assembly, wherein the modular air flow assembly comprises a faceplate, a top plate and a screen, wherein the air is guided into the channel through a plurality of slots in the faceplate, wherein the channel is disposed behind the faceplate and between a bottom surface of a top portion of the faceplate, a bottom surface of the top plate and a top surface of the screen;
guiding the air through a plurality of openings in the screen; and
guiding the air adjacent to a heat generating component in a removable line card of a switch.

14. The method of claim 13, wherein the top plate is substantially perpendicular to a front portion of the faceplate, and substantially parallel to the top portion of the faceplate.

15. The method of claim 13, wherein the screen is substantially parallel to the top plate.

16. The method of claim 13, wherein the top plate comprises a substantially solid plate.

17. The method of claim 13, wherein air is guided through the slots, then along the channel and through the plurality of openings to one or more heat generating components on the line card.

18. The method of claim 13, wherein a fan is used to help guide the air through the slots.

19. The method of claim 13, wherein the faceplate has a plurality of openings to accommodate ports in the line card.

* * * * *